United States Patent [19]
Nishimura

[11] Patent Number: 4,789,833
[45] Date of Patent: Dec. 6, 1988

[54] METHOD FOR CORRECTING POSITION DEVIATION DUE TO STATIC MAGNETIC FIELD CHANGE IN NMR IMAGING DEVICE

[75] Inventor: Hiroshi Nishimura, Kashiwa, Japan
[73] Assignee: Hitachi Medical Corp., Tokyo, Japan
[21] Appl. No.: 113,604
[22] Filed: Oct. 28, 1987
[30] Foreign Application Priority Data Oct. 29, 1986 [JP] Japan .................... 61-255666

[51] Int. Cl.⁴ .......................... G01R 33/20
[52] U.S. Cl. .................... 324/320; 324/309
[58] Field of Search ............ 324/300, 307, 312, 313, 324/318, 319, 320, 322

[56] References Cited
U.S. PATENT DOCUMENTS 4,284,950  8/1981  Burl ............................ 324/320
4,523,166  6/1985  Gross .......................... 324/320
4,581,582  4/1986  Redington ................... 324/309
4,585,992  4/1986  Maudsley .................... 324/309
4,633,179 12/1986  Sugimoto .................... 324/309
4,647,858  3/1987  Bottomley ................... 324/320
4,652,826  3/1987  Yamamoto ................... 324/320
4,663,591  5/1987  Pelc et al. .................. 324/309
4,670,716  6/1987  Kunz .......................... 324/309
4,672,318  6/1987  Sekihara ..................... 324/320
4,720,679  1/1988  Patrick ....................... 324/320

Primary Examiner—Michael J. Tokar
Attorney, Agent, or Firm—Antonelli, Terry & Wands

[57] ABSTRACT

An NMR imaging device comprises a circuit for applying a static magnetic field to an object to be examined, a circuit for applying gradient magnetic fields to the object, a circuit for applying radio frequency pulses to the object to cause nuclear magnetic resonance (NMR) in atomic nuclei of atoms constituting tissue of the object, a circuit for detecting the NMR signals thus generated, and means for Fourier-transforming the NMR signals to reconstruct an NMR image. In this NMR imaging device, only a gradient magnetic field in the slice direction is applied to the object without applying a gradient magnetic field in the frequency encode direction and a gradient magnetic field in the phase encode direction, 90 degree and 180 degree radio frequency pulses are applied to the object at predetermined intervals, the NMR signals thus generated are detected and Fourier-transformed, and a static magnetic field intensity is detected from the resultant frequency spectrum to provide a suitable parameter for imaging, thereby providing the NMR image free from any position deviation.

6 Claims, 7 Drawing Sheets

METHOD FOR CORRECTING POSITION DEVIATION DUE TO STATIC MAGNETIC FIELD CHANGE IN NMR IMAGING DEVICE

BACKGROUND OF THE INVENTION

This invention relates to a nuclear magnetic resonance (NMR) imaging method and more particularly to a method for absorbing time change of the static magnetic field in an NMR imaging device to remove the positional deviation of an NMR image on measurement thereof.

An NMR imaging (simply referred to as MRI) is a system for imaging anatomic or biochemical information based on the protons or other nuclides. The image therein includes a nuclear spin density image itself, the nuclear spin density image enhanced with a longitudinal relaxation time $T_1$ or lateral relaxation time $T_2$, and $T_1$ calculated image or $T_2$ calculated image. The NMR imaging makes it possible to see, as images, the parameters related with tissues, which provides medically important information in judging the abnormality of the tissue.

In measurement of NMR phenomena, an object to be examined is placed in a static magnetic field, which can be generated by a permanent magnet, resistive magnet or superconductive magnet, and is irradiated with RF (radio frequency) pulses (or selectively excited pulses). Subsequently, the resonance signals emitted from the object are received. The NMR imaging is carried out in such a way that the NMR signals are measured under the condition where a gradient magnetic field is applied and thereafter the resultant images are reconstructed. More specifically, the object is irradiated with the RF pulses under the condition where the gradient magnetic field is applied and the NMR signals produced from the examination region of the object are encoded as spatial information.

The gradient magnetic field is employed for encoding the space for the reason why a nuclear resonance frequency $\omega$ is in a linear relation with the magnetic field. Specifically, if the gradient magnetic field remains spatially linear, the spatial position of the examination region is linearly related with the resonance frequency. Thus, the position information of the object can be obtained by only Fourier transforming the NMR signals, which are time information, so as to be changed into a frequency axis. This can be employed to reconstruct the image.

However, if the static magnetic field is changed, a problem of position deviation occurs. The problem of the position deviation can be considered individually in a two-dimentional image and in a slice direction perpendicular thereto.

Generally, the NMR imaging device for medical use takes several minutes or more for normal measurement and thus uses a multi-slice technique to provide a number of images through one measurement. A number of images can be obtained by irradiating object slices with selectively excited pulses at the center frequency corresponding to the object slice in a condition where the gradient magnetic field is applied. Then, if the static magnetic field is being varied, the signal at different slice position from the predetermined slice position will be measured. This results in undesired anatomic position deviations.

The details of the above phenomenon will be explained with reference to FIG. 1. It is assumed that the center frequency corresponding to a prescribed slice position is $\omega_0$, that is, the center frequency decided by the static magnetic field at the isocenter is $\omega_0$. Now, it is assumed that the above center frequency is varied to $\omega_1$ by the change of the static magnetic field due to the ambient temperature. In such a situation, when the slice position has been set so as to correspond to the center frequency of $\omega_0$, as seen from the upper frequency axis of FIG. 1, the slice position is $S_0$. However, if the center frequency has been varied to $\omega_1$ due to the ambient temperature change, the center frequency $\omega_1$ at the isocenter becomes a central point of the gradient magnetic field. If $\omega_1 > \omega_0$, the slice position corresponding to the center frequency $\omega_0$ is $S_1$ which is a position leftwardly shifted from $S_0$ in FIG. 1.

Also in the two-dimensional image, if the frequency decided by the static magnetic field at the isocenter in a static magnetic space is different from assumed center frequency, position deviation occurs in the direction of frequency encoding.

The above phenomenon will be explained in detail with reference to FIGS. 2 and 3. The detection of NMR signals is defined as taking a difference signal between the frequency of a received signal and a predetermined center frequency. It is now assumed that the predetermined center frequency $\omega_1$ is different from the proton resonance frequency $\omega_0$ decided by the static magnetic field at the isocenter in an imaging space.

FIG. 2 schematically shows a time sequence in a typical spin echo measurement. In FIG. 2, RF shows timings of irradiating RF signals and its envelope for selective excitation, $G_z$ shows timings of applying a gradient magnetic field in the slice direction; $G_y$ shows timings of applying a gradient magnetic field in the direction of phase encoding and the amplitudes thereof varied; $G_x$ shows timings of applying a gradient magnetic field in the direction of frequency encoding. Signal shows NMR signals to be measured; and the lowest stage shows plural sections of the time-sequence.

During the section 1, the 90 degree selective excitation pulse is irradiated onto an object and also the slice direction gradient magnetic field is applied. During the section 2, the gradient magnetic field in the phase encode direction is applied to provide the rotation of a nuclear spin dependent upon the position in the y direction. During the section 3, any signal is not applied. During the section 4, the 180 degree selective excitation pulse is irradiated and also the gradient magnetic field in the slice direction is applied. During the section 5, the gradient magnetic field in the frequency encode direction is applied and the NMR signal is measured.

Meanwhile, although during the sections 1 and 4, the pulse at the frequency $\omega_z$ is irradiated, during the section 5 when the NMR signal is measured, the frequency must be essentially returned to the proton resonance frequency which is decided by the static magnetic field intensity at the isocenter in an imaging space. At this stage, if the predetermined center frequency $\omega_1$ which is to be essentially equal to $\omega$ is different from $\omega_0$, the position deviation will be measured in the direction of frequency encoding. More specifically, as already mentioned, the NMR signal is measured as the difference frequency from the center frequency so that the center of the resultant image corresponds to the frequency $\omega_0$. Thus, if the predetermined frequency is not $\omega_0$ but $\omega_1$, the position deviation corresponding to the difference frequency $|\omega_0 - \omega_1|$ will occur in the frequency encode direction on the two dimentional image (see FIG. 3). The direction of deviation depends upon if the frequency encode gradient magnetic field is positive or negative in the x-axis direction.

From the above explanation, it is apparent that change in the static magnetic field intensity gives rise to position deviation measured in imaging. To obviate this disadvantage, the technique of "magnetic field locking" which is disclosed in Kazuo Toori et al "JITSUYO NMR, CW.FT NMR NO TSUKAIKATA" Aug. 10, 1985, pp. 67-69, has been commonly used. This magnetic field locking is a technique in which when the static magnetic field is changed from the assumed central magnetic field at the center of imaging, it is increased or decreased by the difference to coincide with the predetermined center magnetic field, that is, to lock it. To implement this technique, the NMR imaging device using a permanent magnet or resistive magnet is provided with shim coils which are capable of changing the static magnetic field; the assumed center magnetic field is so controlled as to be constant by coil current.

However, this magnetic field locking technique has the following disadvantages. If the magnet having a negative temperature coefficient is used as in the permanent magnet NMR imaging device, the current flowing through the shim or correcting coil generates heat, thus further decreasing the static magnetic field, which requires the current to be further increased. Such a vicious circle can be cut by slightly cancelling the static magnetic field generated in the permanent magnet by always passing the current through the shim coil. Specifically, if the current to be passed through the coil is decreased when the ambient temperature is increased and the static magnetic field generated by the permanent magnet is decreased, the static magnetic field can be restored to the assumed magnetic field at the center of imaging and also the current generation is decreased due to the decreased current.

Such an arrangement, however, requires that the magnetic field to be cancelled by the shim coil is supplemented by intensifying the permanent magnet. This disadvantageously increases the fabrication cost of the static magnetic field generating device using permanent magnet as an NMR imaging device.

SUMMARY OF THE INVENTION

An object of this invention is to provide an NMR imaging method which is capable of readily correcting position deviation without using shim coils for correcting static magnetic field.

To attain this object, this invention is characterized in that prior to imaging, the NMR signals measured without applying to an object to be examined a gradient magnetic field in the phase encode direction and gradient magnetic field in the frequency encode direction are Fourier-transformed to detect a static magnetic field intensity, thereby following a center frequency to remove any position deviation in imaging.

To remove any position deviation in imaging, in accordance with this invention, there is adopted, not the magnetic field locking technique of the prior art, but a technique which follows the center frequency changing with the static magnetic field variation to lock the center frequency to the static magnetic field intensity but doesn't require shim coils for correcting the static magnetic field.

BRIEF DESCRIPTION OF THE DRAWINGS

These and other objects and features will be apparent from the following description taken in conjunction with the accompanying drawings, in which.

DESCRIPTION OF THE PREFERRED EMBODIMENTS

Figure 4:
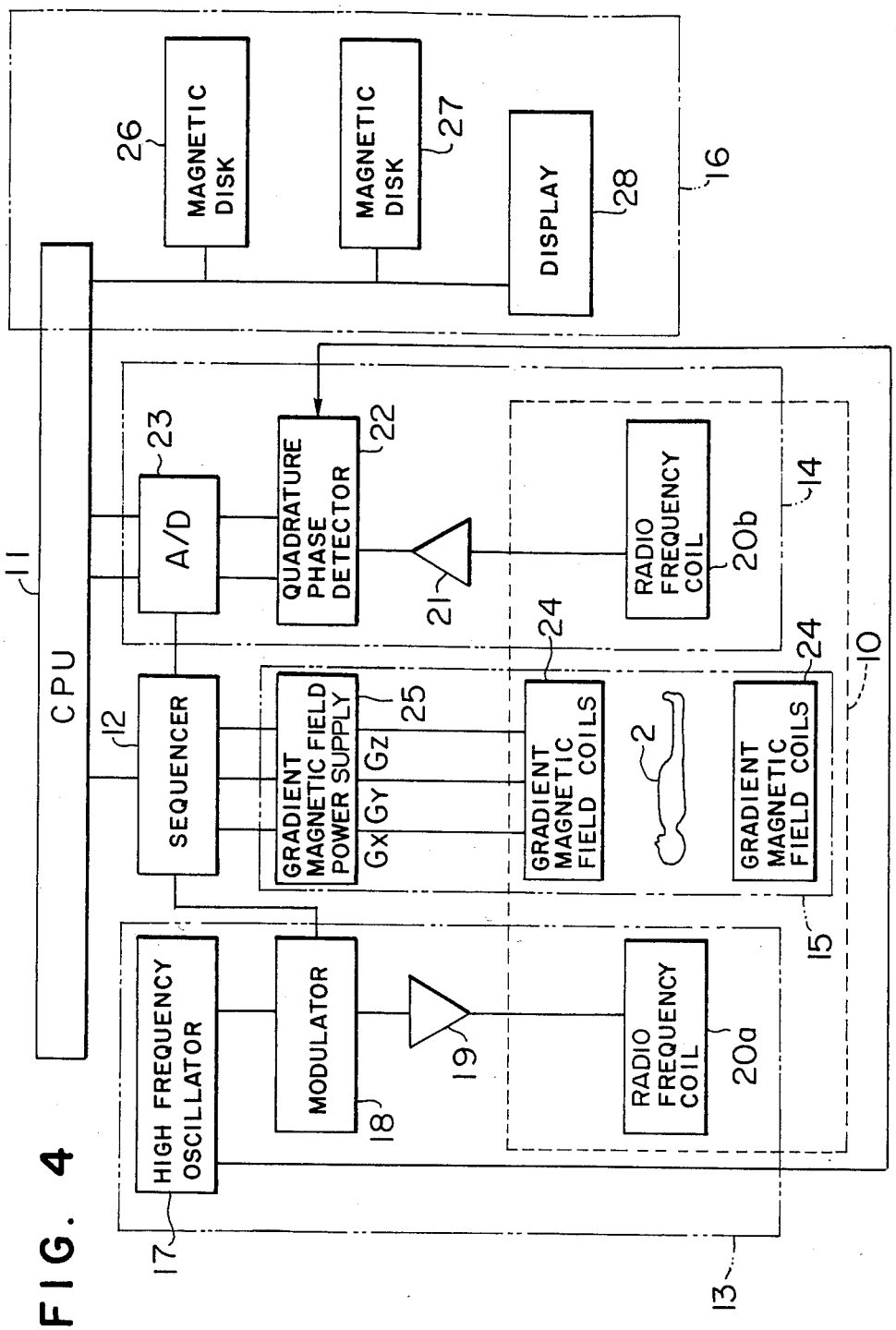
FIG. 4 is a block diagram of an entire arrangement of an NMR imaging device according to this invention.

Hereinafter, a preferred embodiment of this invention will be explained. In FIG. 4 showing an entire arrangement of an NMR imaging device according to this invention which provides tomograms using NMR phenomena, it essentially consists of an static magnetic field generating magnet 10, a central processing unit (CPU) 11, a sequencer 12, a transmitter unit 13, a receiver unit 14, a gradient magnetic field unit 15 and a signal processing unit 16. The static magnetic field generating magnet 10 serves to generate, around an object 2 to be examined (e.g. human body), a strong and uniform static magnetic field in the direction of a body axis or in the direction perpendicular thereto. Magnetic field generating means of permanent magnet, resistive magnet or superconductive magnet is arranged in the space having a certain expanse around the object. The sequencer 12, which is operated under the control by the CPU 11, serves to transfer several instructions necessary for collecting the data of tomograms of the object 2, at certain timings to the transmitter unit 13, the gradient magnetic field generating unit 15 and the receiver unit 14. The transmitter unit 13 includes a high frequency oscillator 17, a modulator 18, a video frequency amplifier 19 and radio frequency transmitter coil 20a. In the operation of the transmission unit 13, high frequency pulses are first generated from the radio frequency oscillator 17; the radio frequency pulses thus generated are amplitude-modulated by the modulator 18 in accordance with an instruction signal from the sequencer 12 so as to be selectively excited, the radio frequency pulses amplitude-modulated are amplified by the high frequency amplifier 19 and thereafter supplied to the radio frequency coil 20 arranged in proximity to the periphery of the object 2. Thus, radio frequency electromagnetic waves are irradiated to the object 2.

After a specific section of the object 2 is excited, the supply of the radio frequency pulses is stopped. Then, after a certain time, weak electromagnetic waves are emitted from the object 2. In order to receive the electromagnetic waves emitted, the receiver unit 14 includes a radio frequency receiver coil 20b, an amplifier 21, a quadrature phase detector 22, and an A/D converter 23. In the operation of the receiver unit 14, the weak electromagnetic waves emitted from the object 2 are detected by the radio frequency receiver coil 20b, which is arranged in proximity to the periphery of the object 2, the electromagnetic waves detected are transferred to the A/D converter 23 through the amplifier 21 and the quadrature phase detector 22, thus being converted into digital amounts. Then, the timing of signal processing is such that the outputs from the quadrature phase detector 22 are collected as two series of sampling data in accordance with an instruction from the sequencer 12 and the data collected are transferred to the signal processing unit 16.

The gradient magnetic field generating unit 15 consists of gradient magnetic field coils 24 which are arranged to generate the magnetic fields having the gradients in respectively orthogonal three axis X, Y and Z directions and a gradient magnetic field power supply 25 which drives the respective coils 24. In operation, the gradient magnetic field power supply 25 for the respective coils in accordance with an instruction from the sequencer to apply the gradient magnetic fields $G_X$, $G_Y$ and $G_Z$ in the three X, Y, and Z directions to the object 2. By changing the manner of applying the gradient magnetic fields, the tomogram section of the object 2 can be optionally set up to the arbitrary angle to the axis.

The signal processing unit 16 essentially consists of the CPU 11, a recording device such as a magnetic disk 26, a magnetic tape 27, etc., and a display device 28 such as a CRT. In operation, the NMR signals provided in the CPU 11 are subjected to the processing such as Fourier transform, phase correction, etc. to create a reconstructed image, thereby imaging the signal intensity distribution on a certain tomogram section or the distribution of plural signal groups subjected to any suitable arithmetic operation to be shown on the display device 28. Incidentally, the transmitter and receiver coils 20a, 20b and the gradient magnetic field coils 24 are located in the imaging space of the static magnetic field generating magnet 10 arranged in the space surrounding the object 2

Several materials have been proposed as the permanent magnet to be employed as the static magnetic field generating magnet 10 A rare-earth magnet (Nd-Fe-B), which has been recently used, is the highest in the maximum energy product but also has a high temperature coefficient. It has a so-called negative temperature coefficient that when the ambient temperature is increased, the generated static magnetic field is weakened. One example thereof has a temperature coefficient as great as −1000 ppm/°C. With this temperature coefficient, when the ambient temperature is increased by 1° C., the static magnetic field is weakened by 1000 ppm which corresponds to 1 Gauss for the static magnetic field of 1000 Gauss, for example. In this case, to what extent the position deviation occurs on the image will be described below.

Figure 5:
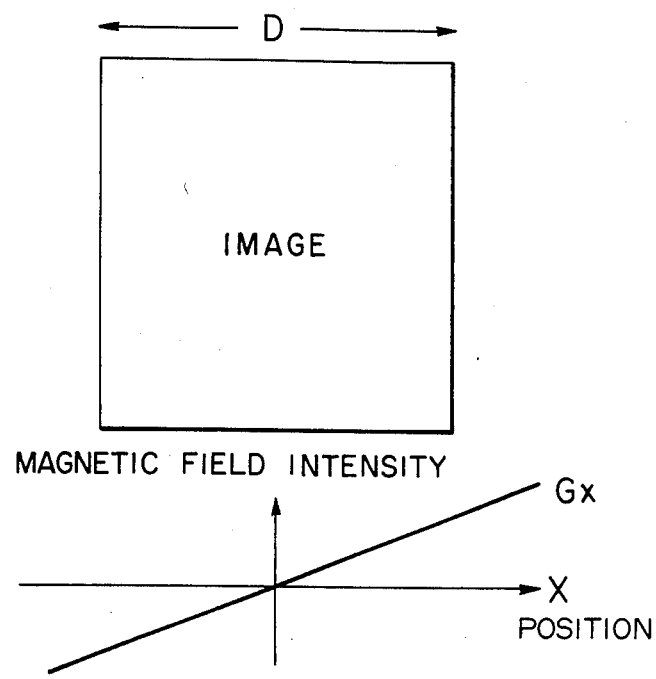
FIG. 5 is a view showing the relation between the field of view and the image.

FIG. 5 shows the relation between a two-dimensional image and a gradient magnetic field in imaging it. It is assumed that the gradient magnetic field remains linear everywhere. Now assuming that the gradient magnetic field in the x-axis direction is $G_x$, the magnetic field $B_1$ at a certain position x is written by $$B_1 = G_x x \ldots \quad (1)$$

Thus, assuming that the size of the field of view in a two-dimensional image is D, the difference $\Delta B$ of the magnetic field intensity between both ends of the field of view is expressed as $$\Delta B = G_x D \ldots \quad (2)$$

For example, if the gradient magnetic field $G_x = 0.15$ Gauss/cm and D=30 cm, $$\Delta B = 4.5 \text{ Gauss} \ldots \quad (3)$$

Thus, assuming that the magnetic field has been varied by 1 Gauss due to temperature change, $$1/\Delta B \times D = 6.7 \text{ cm} \ldots \quad (4)$$

This means the position deviation of 22.2% for the entire field of view.

This position deviation will occur also in the slice direction by the same extent.

The cause of the position deviation resides in that although the static magnetic field in the object imaging space has changed due to temperature change, the center frequency for the assumed central magnetic field in the center of imaging space has not been changed correspondingly.

As well known, between a magnetic field B and a Larmor frequency $\omega$, $$\omega = \gamma B$$

where $\gamma$ is a gyromagnetic ratio of a noticed nuclear spin. For example, for a proton, $$\gamma = 4257.59 \times 2\pi (\text{rad/sec})/\text{Gauss}$$

Thus, for the static magnetic field of 1000 Gauss, the NMR frequency is 4.25759 MHz. 1 Gauss corresponds to 4.26 KHz.

A problem has occurred from the fact that although the static magnetic field intensity has decreased by 1 Gauss and thus the center frequency is changed to $$4.25759 - 0.00426 = 4.25333 \text{ MHz},$$

the NMR signal has been measured considering the center frequency to remain 4.25759 MHz. Since the NMR signal has been reconstructed through Fourier transform, the image with the origin deviated by the distance corresponding to the difference frequency 4.26 KHz due to temperature change is created.

In order to solve this problem, in accordance with this invention, a technique of following the center frequency is employed in place of the conventional magnetic field locking technique. The center frequency following technique in accordance with this invention is to make zero the difference frequency mentioned above and more specifically to always monitor the change in a static magnetic field intensity to cause the center frequency to follow it.

Figure 1:
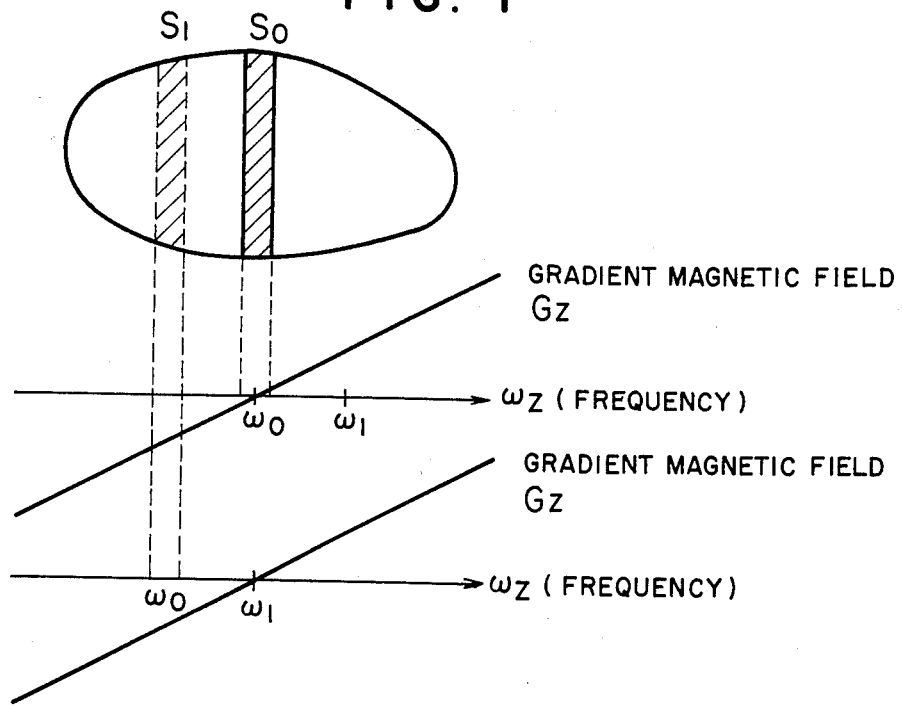
FIG. 1 shows a view showing a position deviation in slice direction.
Figure 3:
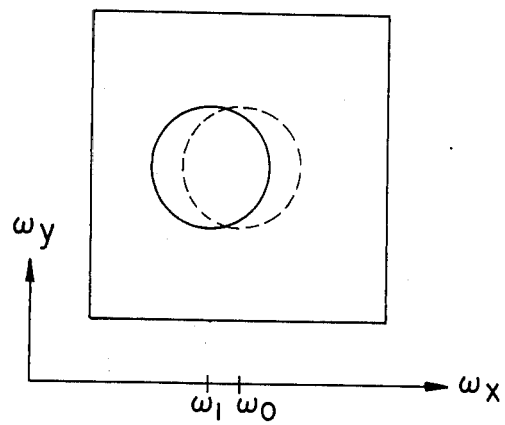
FIG. 3 shows a view showing a position deviation in a two-dimensional image.
Figure 2:
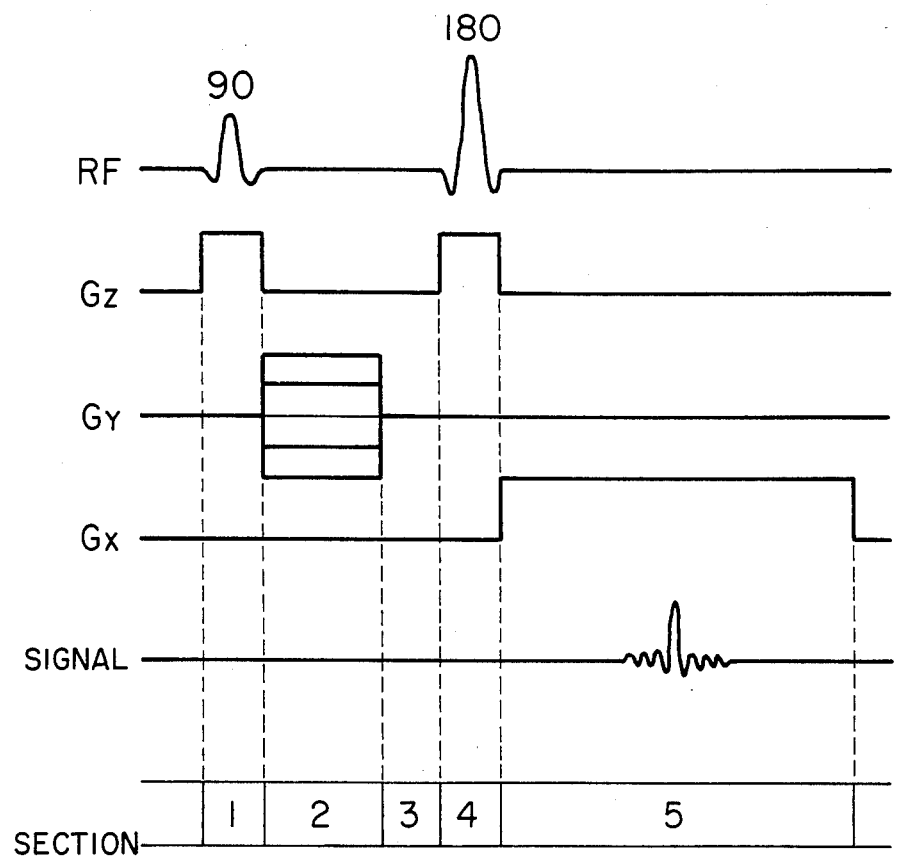
FIG. 2 shows a view showing the time sequence of measuring NMR signals in a two-dimensional Fourier transform imaging.
Figure 6:
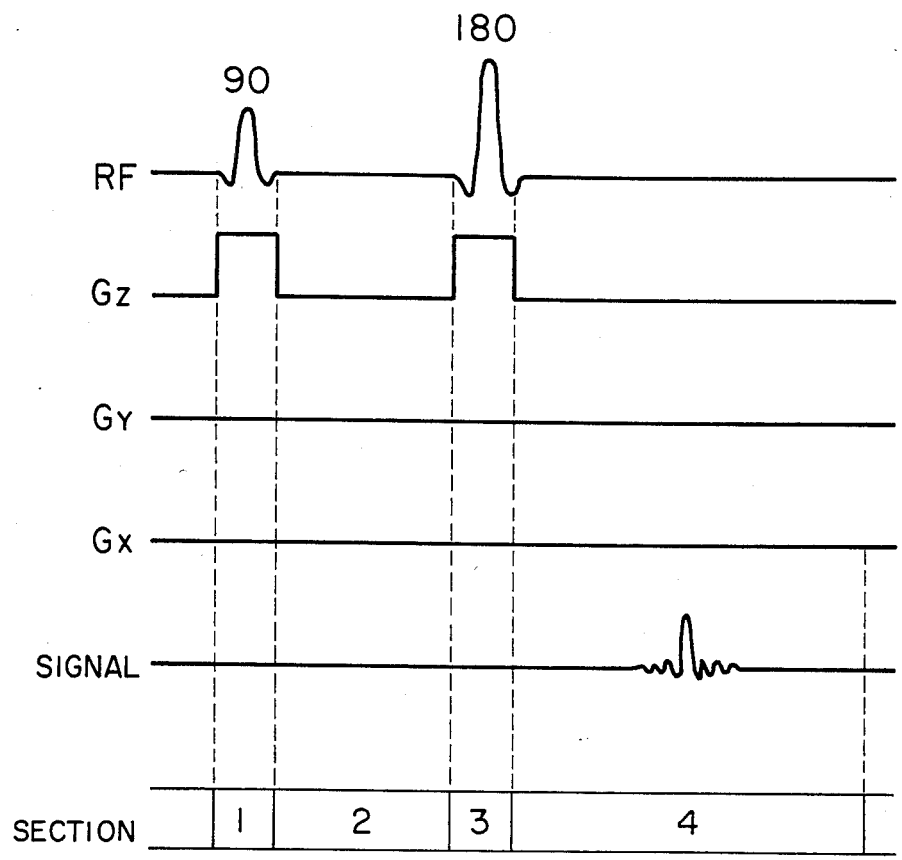
FIG. 6 is a view showing the time sequence of measuring a center frequency.

FIG. 6 shows a time sequence of measuring a center frequency. In FIG. 6, reference symbols has the same meanings as in FIG. 2.

In the time sequence of FIG. 6, it is assumed that the center frequency has been previously set to an assumed value $\omega_0$. Thus, the selectively excitation waveform is the amplitude-modulated sine wave signals at the frequency of $\omega_0$. During the section 1, the amplitude-modulated, 90 degree selective excitation radio frequency pulse at the frequency $\omega_0$ is irradiated onto the object and also the gradient magnetic field in the slice direction $G_z$ is applied. During the section 2, any signal is not applied to the object. During the section 3, the amplitude-modulated 180 degree selective excitation radio frequency pulse is irradiated to the object and also the gradient magnetic field in the slice direction $G_z$ is applied. Thus, the nuclear spin on a specific tomogram section is reversed in a rotating coordinate system. During the section 4, the NMR signal is measured without applying any gradient magnetic field.

Figure 7:
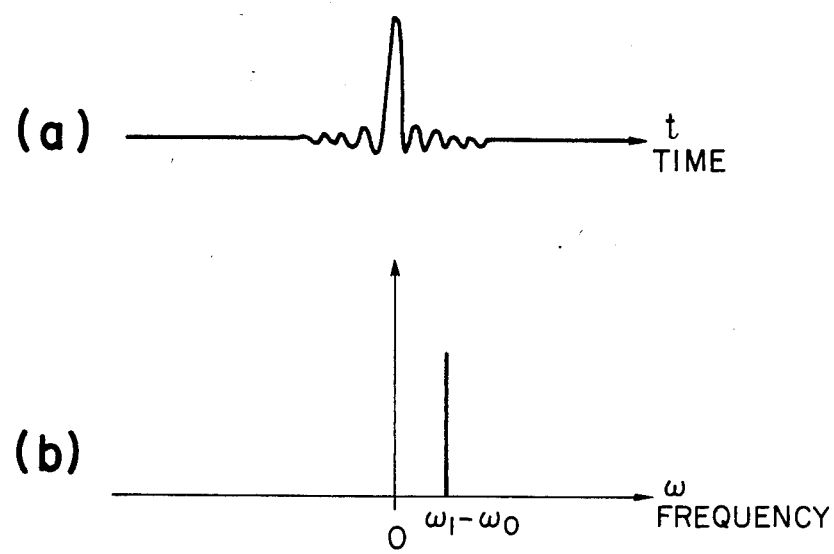
FIG. 7($a,b$) is a view showing an NMR signal and its Fourier transform.

Since the NMR signals thus measured have been collected without applying the gradient magnetic field in the frequency encode direction $G_x$ and the gradient magnetic field in the phase encode direction $G_y$, the Fourier transforms thereof don't include the position information relative to the nuclear spin on the excited tomogram section, and constitute a spectrum to be used in a spectrocopy region. Thus, the abscissa in the Fourier transformed region is frequency. FIG. 7(a) illustrates the NMR signal measured in the manner mentioned above, with the abscissa being time. FIG. 7(b) illustrates the Fourier transform thereof, with the abscissa being frequency.

If the center frequency $\omega_1$ decided by a static magnetic field intensity is different from the one for the assumed center frequency $\omega_0$, as seen from FIG. 7(b) the peak of the spectrum is not located at the origin of the spectrum coordinate but at the position deviated by $\omega_1\omega_0$. Therefore, in order that the resonance frequency coincides with the center frequency, the above difference frequency $\omega_1 - \omega_0$ is added to the previously assumed center frequency $\omega_0$ thereby to provide a new center frequency.

Figure 8:
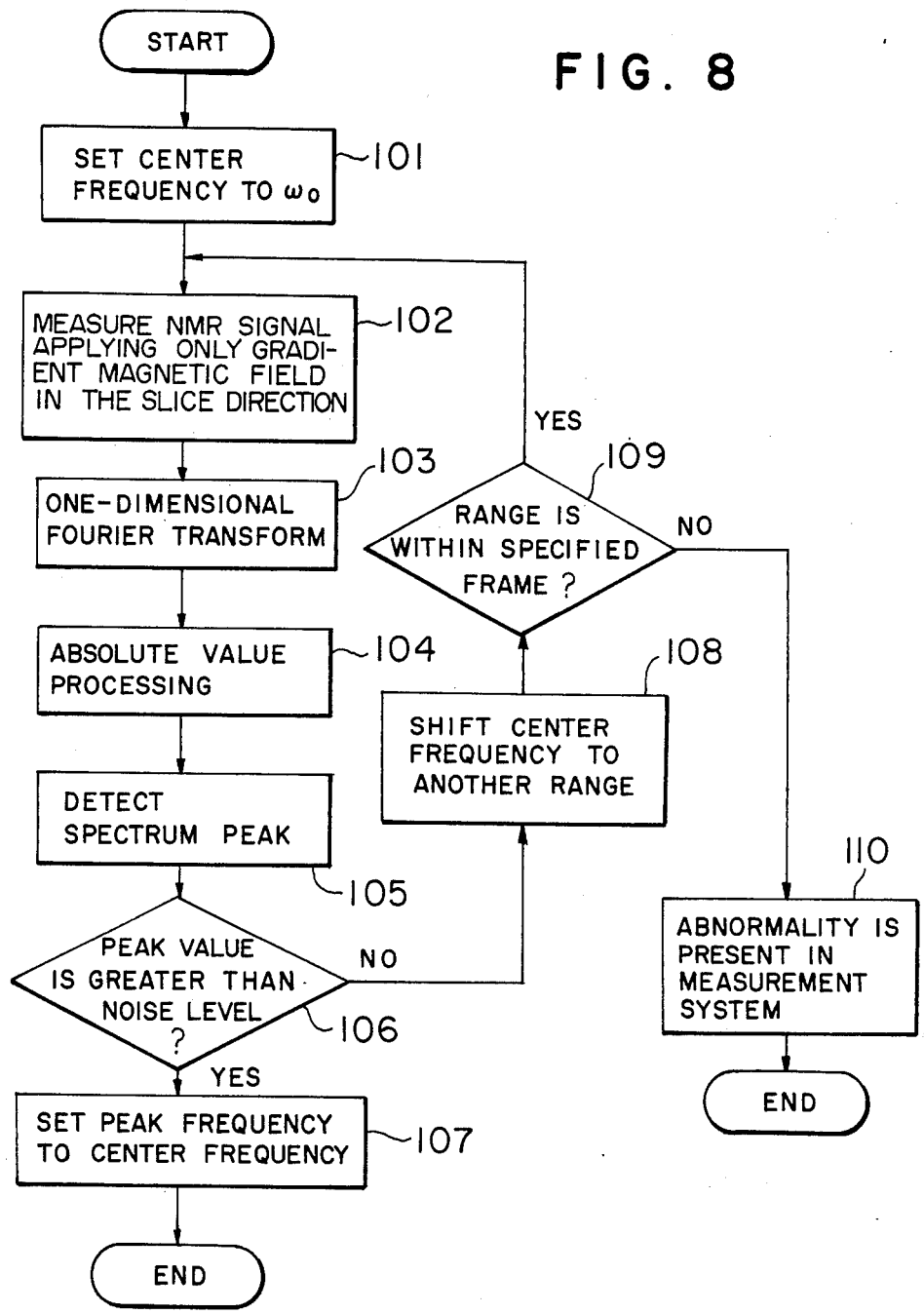
FIG. 8 is a flowchart showing a processing procedure in one embodiment according to this invention.

A concrete processing procedure of the embodiment of this invention will be explained in connection with FIG. 8. First, a suitable central frequency $\omega_0$ is set (Step 101). Next, the NMR signal measurement is performed without applying the gradient magnetic fields other than the gradient magnetic field in the slice direction (Step 102). The digital signal thus obtained is Fourier-transformed in one direction (Step 103), subjected to absolute value processing for complex number (Step 104) and thereafter the peak value of the spectrum thus formed is detected (Step 105). If this peak value is higher than the noise level (Step 106, "YES"), the difference frequency $\Delta\omega$ indicative of the peak value is calculated and a new center frequency $\omega_1$ expressed as $$\omega_1 = \omega_0 + \Delta\omega \ldots \quad (6)$$

is set (Step 107).

If the peak value is equal to the noise level or less (Step 106, "NO"), the previously set frequency $\omega_0$ is shifted to another frequency range (Step 108). Even when the frequency range is thus changed, the peak value may not be obtained within the specified frequency range (Step 109, "NO"). Then, the processing is terminated under the judgement of the presence of abnormality of the measurement system (i.e. abnormal termination) (Step 110). If not so (Step 109, "YES") the processing is returned to the step of measuring the NM signal.

Figure 9:
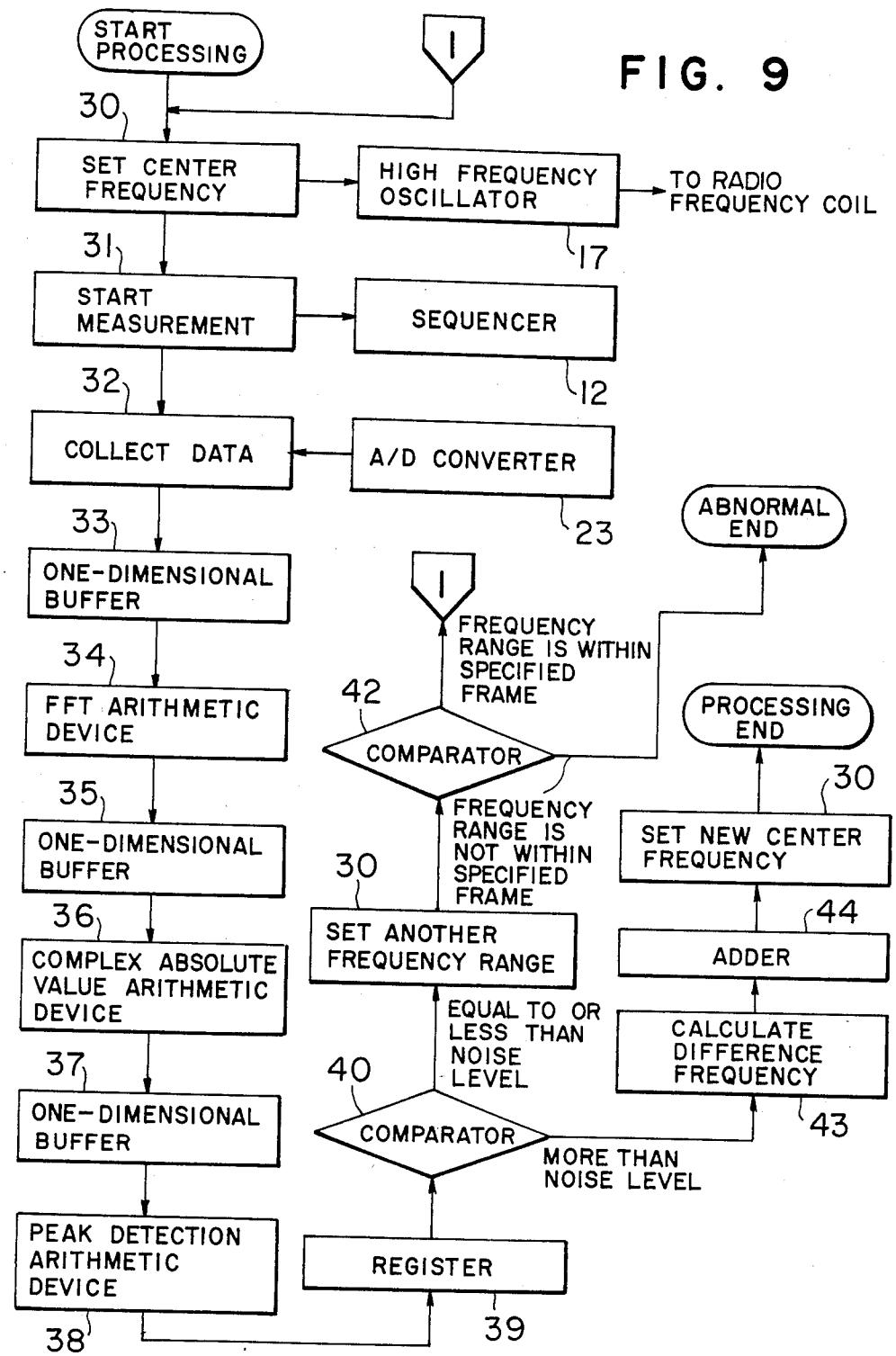
FIG. 9 is a block diagram showing internal component blocks in the CPU in FIG. 4 in their processing flowchart.

The above processing can be performed by a dedicated hardware in such a manner as shown in FIG. 9. FIG. 9 shows inner component blocks in the CPU of FIG. 4 along their processing flowchart. However, it should be noted that FIG. 4 shows the main components of the entire NMR imaging device, while FIG. 9 shows the operations of the main components in the embodiment of this invention in their flowchart and so plural blocks with the same reference number are included in FIG. 4. Also it should be noted that the blocks in FIG. 9 which are not shown in FIG. 4 are included in the CPU 11, magnetic disk 26 or magnetic tape 27.

In the processing shown in FIG. 9, first, an assumed center frequency $\omega_0$ is set in the radio frequency oscillator 17 by a center frequency set up I/F (interface) 30. Next, the sequencer 12 is actuated by a measurement starting I/F 31 to start the measurement of NMR signal. Then, the gradient magnetic field in the frequency encode direction and the gradient magnetic field in the phase encode direction are not applied. The NMR signals digitized by the A/D converter 23 during the measurement are stored in a one-dimensional buffer memory 33 through a data collection circuit 32. When the measurement is completed, the contents of the one-dimensional buffer memory are Fourier-transformed by a FFT (fast Fourier transform) arithmetic device 34. The resultant data thereof is transferred to a one-dimensional buffer memory 35. Since the measured data are complex data each consisting of a real part and an imaginary part, the absolute values thereof are calculated by a complex absolute value arithmetic device 36 and the absolute values are transferred to a one-dimensional buffer memory 37. The peak value among the absolute values is taken out by a peak detection arithmetic device 38 and loaded in a register 39.

The value loaded in the register 39 are compared with a preset noise level by a comparator 40. If it is equal to or less than the noise level, it is set to another frequency range under the judgement that the peak has not been properly detected. Concretely, this is carried out by adding a certain increment to or subtracting it from the present center frequency in the frequency range set I/F 30. Whether or not the frequency range is a preset frame is judged in a comparator 42. If this is negative, the processing is abnormal-terminated. If the frequency range is within the frame, the processing is returned to the center frequency set I/F 30 to start again the detection of the peak value mentioned above. Incidentally, a frame of specifying the frequency range to be used is preset in the comparator 42.

If it has been found that the peak value is not lower than the noise level, a frequency difference from the center frequency is calculated by a difference frequency calculating circuit 43. The difference frequency is added to the present center frequency by an adder 44. The frequency thus provided is set as a new center frequency in the radio frequency oscillator 17 through the center frequency I/F 30. Thus, the processing is terminated.

As mentioned above, if in accordance with this invention, the center frequency is previously measured prior to the NMR imaging, the measurement free from position deviation can be preformed without using the magnetic field locking technique.

Although in the embodiment mentioned above, selectively excitation radio frequency pulses at 90 degree and 180 degree which are accompanied by the application of gradient magnetic field in the slice direction have been used, it should be noted that both non-selective excitation pulses may be employed.

Accordingly, in accordance with this invention, without the necessity of providing shim coils for correcting a static magnetic field and the circuit for magnetic field locking, images free from position deviation can be created only by the provision of simple means.

I claim:

1. In an NMR imaging device comprising means for applying a static magnetic field to an object to be examined, means for applying to the object a gradient magnetic field in a slice direction, a gradient magnetic field in a phase encode direction and a magnetic field in a frequency encode direction, means for applying radio frequency pulses to the object to cause nuclear magnetic resonance (NMR) in atomic nuclei of atoms constituting tissues of the object, means for detecting the NMR signals thus generated, and means for Fourier-transforming the NMR signals to reconstruct an NMR image, a method for correcting deviation of a static magnetic field intensity comprising the steps of:

a first step of placing the object in the static magnetic field;

a second step of applying the gradient magnetic field in the slice direction and also applying a 90 degree radio frequency pulse at a preset center frequency of $\omega_0$ corresponding to a slice position, which is decided by said static magnetic field and said gradient magnetic field in the slice direction;

a third step of, after the application of said gradient magnetic field in the slice direction and said 90 degree radio frequency pulse have been cancelled during a predetermined period, applying the gradient magnetic field in the slice direction and a 180 degree radio frequency pulse at a center frequency of $\omega_0$;

a fourth step of detecting an NMR signal thus produced;

a fifth step of Fourier-transforming said NMR signal to provide a peak frequency $\omega_1$ of the resultant frequency spectrum; and a sixth step of obtaining the frequency difference between $\omega_0$ and $\omega_1$ and adding it to the frequency $\omega_0$.

2. In an NMR imaging device comprising mean for applying a static magnetic field to an object to be examined, means for applying to the object a gradient magnetic field in a slice direction, a gradient magnetic field in a phase encode direction and a magnetic field in a frequency encode direction, means for applying radio frequency pulses to the object to cause nuclear magnetic resonance (NMR) in atomic nuclei of atoms constituting tissues of the object, means for detecting the NMR signals thus generated, and means for Fourier-transforming the NMR signals to reconstruct an NMR image, a method for correcting deviation of a static magnetic field intensity comprising the steps of:

a first step of placing the object in the static magnetic field;

a second step of applying 90 degree and 180 degree radio frequency pulses at a preset center frequency of $\omega_0$ at predetermined time intervals;

a third step of detecting an NMR signal thus produced;

a fourth step of Fourier-transforming said NMR signal to provide a peak frequency $\omega_1$ of the resultant frequency spectrum; and a sixth step of obtaining the deviation difference between $\omega_0$ and $\omega_1$ and adding it to the frequency $\omega_0$.

3. A method for correcting deviation of a static magnetic field intensity in an NMR imaging device according to claim 1, wherein in said third step, without applying the gradient magnetic field in the slice direction and the 180 degree high frequency pulse, the gradient magnetic field in the frequency encode direction is applied to provide an echo signal by reversing it.

4. A method for correcting deviation of a static magnetic field intensity in an NMR imaging device according to claim 2, wherein in said second step, without applying the 180 degree radio frequency pulse, the gradient magnetic field in the frequency encode direction is applied to provide an echo signal by reversing it.

5. A method for correcting deviation of a static magnetic field intensity in an NMR imaging device according to claim 1, wherein said sixth step includes such a process that the peak value in the spectrum is compared to a preset noise level; when the former is less than the latter, the range in the center frequency $\omega_0$ is changed to provide the peak value in the changed range; and if the peak value is obtained, the processing proceeds to the sixth step while if not the processing is terminated.

6. An NMR imaging device comprising:

means for applying a static magnetic field to an object to be examined;

means for applying gradient magnetic fields to the object;

means for applying radio frequency pulses to the object to cause nuclear magnetic resonance (NMR) in atomic nuclei of atoms constituting tissues of the object;

means for detecting the NMR signals thus generated;

means for Fourier-transforming the NMR signals to reconstruct an NMR image;

said means for applying gradient magnetic fields to the object applying only a gradient magnetic field in a slice direction but not applying a gradient magnetic field in a frequency encode direction and a gradient magnetic field in a phase encode direction;

said means for applying radio frequency pulses to the object irradiating 90 degree and 180 degree pulses to the object at predetermined time intervals;

said means for detecting the NMR signals comprising means for detecting the NMR signals and detecting the static magnetic field intensity from the spectrum of the NMR signals, which is provided by said Fourier transforming means, and means for suitably correcting a parameter for imaging, thereby providing the NMR image free from any position deviation.

* * * * *